United States Patent
Ruile et al.

(10) Patent No.: US 7,948,333 B2
(45) Date of Patent: May 24, 2011

(54) COMPONENT OPERATED BY GUIDED ACOUSTIC WAVES

(75) Inventors: Werner Ruile, Munich (DE); Markus Hauser, Feldafing (DE); Ulrike Roesler, Hebertshausen (DE)

(73) Assignee: Epcos AG, Munich (DE)

( * ) Notice: Subject to any disclaimer, the term of this patent is extended or adjusted under 35 U.S.C. 154(b) by 84 days.

(21) Appl. No.: 12/093,531

(22) PCT Filed: Nov. 20, 2006

(86) PCT No.: PCT/DE2006/002034
§ 371 (c)(1),
(2), (4) Date: May 13, 2008

(87) PCT Pub. No.: WO2007/059741
PCT Pub. Date: May 31, 2007

(65) Prior Publication Data
US 2008/0266024 A1    Oct. 30, 2008

(30) Foreign Application Priority Data
Nov. 23, 2005  (DE) .......................... 10 2005 055 871

(51) Int. Cl.
*H03H 9/02* (2006.01)
*H01L 41/08* (2006.01)
(52) U.S. Cl. ........................................ 333/193; 333/195
(58) Field of Classification Search .................. 333/133, 333/193, 194, 195, 196
See application file for complete search history.

(56) References Cited

U.S. PATENT DOCUMENTS

| | | | | |
|---|---|---|---|---|
| 4,328,472 | A | * | 5/1982 | Grudkowski ................. 333/141 |
| 6,046,656 | A | | 4/2000 | Mishima |
| 7,151,424 | B2 | * | 12/2006 | Kando .......................... 333/193 |
| 7,262,676 | B2 | | 8/2007 | Ruile et al. |
| 7,322,093 | B2 | * | 1/2008 | Kadota et al. ................... 29/594 |
| 7,323,803 | B2 | * | 1/2008 | Kando ...................... 310/313 A |
| 7,486,001 | B2 | | 2/2009 | Kando |
| 7,619,347 | B1 | * | 11/2009 | Bhattacharjee ........... 310/313 R |
| 7,851,977 | B2 | | 12/2010 | Ruile et al. |
| 2003/0137367 | A1 | | 7/2003 | Kadota |
| 2005/0099091 | A1 | | 5/2005 | Mishima et al. |
| 2005/0162048 | A1 | | 7/2005 | Solal et al. |
| 2006/0076852 | A1 | | 4/2006 | Ruile et al. |
| 2006/0175928 | A1 | | 8/2006 | Kando |

(Continued)

FOREIGN PATENT DOCUMENTS

DE        103 25 281        12/2004

(Continued)

OTHER PUBLICATIONS

Tomar et al., Temperature coefficient of elastic constants of SiO2 over-layer on LiNbO3 for a temperature stable Saw device, Jul. 2003, Journal of Physics D: Applied Physics, 1773-1777.*

(Continued)

*Primary Examiner* — Dean O Takaoka
(74) *Attorney, Agent, or Firm* — Fish & Richardson P.C.

(57) ABSTRACT

A component working with guided acoustic waves includes a layer system configured to guide waves in a lateral plane. The layer system includes a piezoelectric layer, electrodes on the piezoelectric layer for exciting the wave, a dielectric layer with an acoustic impedance, and an adjustment layer with an acoustic impedance. A ratio of the acoustic impedance of the adjustment layer to the acoustic impedance of the dielectric layer is greater than 1.5.

19 Claims, 3 Drawing Sheets

U.S. PATENT DOCUMENTS

| | | |
|---|---|---|
| 2006/0290233 A1 | 12/2006 | Nishiyama et al. |
| 2007/0018536 A1 | 1/2007 | Kadota et al. |
| 2009/0102318 A1 | 4/2009 | Kando |

FOREIGN PATENT DOCUMENTS

| | | |
|---|---|---|
| EP | 0 886 375 | 12/1998 |
| EP | 1635459 | 3/2006 |
| EP | 1732214 | 12/2006 |
| WO | WO01/29964 | 4/2001 |
| WO | WO03/088475 | 10/2003 |
| WO | WO03/088482 | 10/2003 |
| WO | WO2004/095699 | 11/2004 |
| WO | WO2005/069486 | 7/2005 |
| WO | WO2005/083881 | 9/2005 |
| WO | WO2005/086345 | 9/2005 |
| WO | WO2005/093949 | 10/2005 |

OTHER PUBLICATIONS

Kawachi O. et al, "Optimal Cut for Leaky Saw on LiTaO3 for High Performance Resonators and Filters" IEEE Transactions on Ultrasonics, Ferroelectrics and Frequency Control, vol. 48, No. 5, Sep. 2001, pp. 1442-1448, XP-002261269.

K. Yamanouchi et al. "High Temperature Stable High Electromechanical Coupling Substrates and Application for Surface Acoustic Wave Devices" Tohoku Institute of Technology, Sendai, Japan 2001 IEEE Ultrasonics Symposium, pp. 189-192.

International Search Report for PCT/DE2006/002034.

Written Opinion for PCT/DE2006/002034.

English translation of Written Opinion for PCT/DE2006/002034.

H. Kando et al. "RF Filter Using Boundary Acoustic Wave" Murata Mfg. Co. Ltd. 2288 Oshinohara, Yasu-shi, Shiga 520-2393, Japan (Oct. 2006).

Restriction Requirement from related U.S. Appl. No. 12/093,876, dated Feb. 9, 2010.

Response to Restriction Requirement from related U.S. Appl. No. 12/093,876, dated Feb. 15, 2010.

Office Action from related U.S. Appl. No. 12/093,876, dated Apr. 9, 2010.

Amendment in Reply to Action of Apr. 9, 2010 from related U.S. Appl. No. 12/093,876, filed Jul. 8, 2010.

International Preliminary Report on Patentability from related PCT application PCT/DE2006/002029, dated May 27, 2008.

Written Opinion of the International Searching Authority from related PCT application PCT/DE2006/002029, dated May 23, 2008.

Notice of Allowance in U.S. Appl. No. 12/093,876 mailed Aug. 10, 2010, 4 pages.

\* cited by examiner

COMPONENT OPERATED BY GUIDED ACOUSTIC WAVES

CROSS REFERENCE TO RELATED APPLICATIONS

Pursuant to 35 USC §120, this application claims the benefit PCT/DE2006/002034 filed Nov. 20, 2006 which claims the benefit of German Patent Application No. 102005055871.2 filed Nov. 23, 2005. Each of these applications is incorporated by reference in its entirety.

BACKGROUND

Components working with guided bulk waves are known, e.g., from the publications DE 10325281 A1, US 2005/0099091 A1, and U.S. Pat. No. 6,046,656.

SUMMARY

One task to be achieved consists in specifying a component working with guided acoustic waves, which is distinguished by a low temperature coefficient.

A component working with guided acoustic waves will be specified, which comprises a layer system suitable for conducting waves. The layer system comprises a piezoelectric layer, electrodes arranged on this layer, and a dielectric layer, which has a relatively low acoustic impedance $Z_{a0}$. The layer system comprises an adjustment layer with a relatively high acoustic impedance $Z_{a2}$. Here: $Z_{a2}/Z_{a0}>1.5$. In at least one spacing range, the adjustment layer is spaced apart from the piezoelectric layer. As the spacing range, an area is designated in which a certain minimum distance is maintained between the adjustment layer and the piezoelectric layer.

The minimum distance equals, for example, 50 nm. In one advantageous variant, the minimum distance equals 80 nm.

The adjustment layer is spaced apart from the piezoelectric layer advantageously by a layer whose acoustic impedance is less than $1.5\ Z_{a0}$. According to the configuration, this layer can be formed by an electrode layer or the dielectric layer.

The acoustic impedance of the adjustment layer is advantageously greater than that of the piezoelectric layer. In the layer system, the adjustment layer advantageously represents a layer with the highest acoustic impedance.

The electrodes comprise a first electrode layer, which is arranged between the piezoelectric layer and the adjustment layer. For the acoustic impedance $Z_{a1}$ of the first electrode layer, advantageously the following applies: $0.5<Z_{a1}/Z_{a0}<1.5$.

In one advantageous variant, the following applies: $Z_{a2}/Z_{a0}>2.5$. In one advantageous variant, the following applies: $0.5<Z_{a1}/Z_{a0}<2.5$.

The adjustment layer influences the acoustic reflection of the wave considerably. The adjustment of the height position of the adjustment layer, which is decisive for the acoustic reflection of the acoustic wave to be excited in the component, permits the adjustment of an advantageous vertical energy density profile of the acoustic wave relative to the piezoelectric layer, so that predetermined properties of the component can be achieved with respect to high electromechanical coupling and a low temperature coefficient of the center frequency.

Below, advantageous constructions of the specified component will be explained. The piezoelectric layer will be designated here simply as piezo-layer.

The conductive component structures comprise electrodes and contact surfaces connected conductively to these electrodes.

The electrodes are constructed as strips that extend perpendicular to the propagation direction of the acoustic wave to be excited in the component. One arrangement of electrodes realizes at least one electroacoustic transducer. The acoustic wave is excited in the transducer between two successive electrodes that are connected to different electrical potentials.

The layer system comprises a core region and two outer layers, between which the core region is arranged. The propagation velocity in the outer layers is greater than that in the core region. The difference in propagation velocities between the core region and each outer layer can equal, e.g., 20% or more. Such a layer sequence of the layer system is suitable as a wave conductor for the guided acoustic wave, which propagates parallel to the orientation of the layers and vertical to the strip-shaped electrodes of a transducer in which it is excited.

The piezoelectric layer advantageously forms one of the outer layers of the wave conductor. The outer layer can also have a layer composite, which comprises an advantageously relatively thin—e.g., $<\lambda$—piezoelectric layer and another layer or a substrate, e.g., a Si substrate.

In one variant, the core area is formed by a single layer, that is, the adjustment layer. In another variant, the core area comprises a layer sequence that comprises the adjustment layer and at least one other layer, e.g., the dielectric layer with a low wave velocity.

The smallest propagation velocity is located in the core area, in which the acoustic wave is primarily concentrated. In one variant, this area is formed primarily by the adjustment layer, which is formed in this case advantageously as a contiguous or continuous layer. Here, the adjustment layer can also have several sub-layers arranged one above the other and can comprise or form an electrode layer. In this case, however, the adjustment layer can also be structured, e.g., corresponding to the form of the electrodes.

In another variant, the core area comprises the adjustment layer and the dielectric layer or at least areas of the dielectric layer. The adjustment layer has, for example, structures that are structured corresponding to the form of the electrodes. The core area comprises, for example, structures of the adjustment layer spaced apart from each other and areas of the dielectric layer, which fill up the intermediate spaces formed between the adjustment layer structures.

In one variant, the adjustment layer is structured in the region of at least one transducer and/or reflector in such a way that strip-shaped breaks of this layer form a type of acoustic reflector, because a jump in impedance results at each discontinuity of the adjustment layer and consequently results in the reflection of at least one part of the wave. These breaks extend perpendicular to the propagation direction of the wave and can be arranged above the electrodes or between the electrodes. The periodicity of the arrangement of breaks is advantageously essentially the same as in the electrodes of each transducer or reflector.

In one variant, the propagation velocity of the wave in the dielectric layer is less than in the two outer layers. In another variant, the propagation velocity of the wave in the dielectric layer is greater than in the adjustment layer and is advantageously selected so that it can form one of the outer layers or at least one sub-layer of this outer layer.

The wave guiding area forms the core area of a wave guide and is arranged between two wave guide outer layers with an acoustic propagation velocity higher relative to the core area. In the outer layers, the propagation velocity is higher than that in the adjustment layer and optionally higher than in the dielectric layer. One of these outer layers is formed by the piezoelectric layer and the other layer is formed by a cover layer described below.

In one advantageous variant, the adjustment layer comprises at least one metal layer with high acoustic impedance, which contains, e.g., tungsten, molybdenum, gold, and the like. The adjustment layer can be formed by several different sub-layers, which all have a high acoustic impedance and form a layer composite. Instead of only one adjustment layer, several adjustment layers can also be provided, which are separated from each other by a layer with a low impedance $Z<Z_{a2}$. For several adjustment layers, according to the configuration, they can all be electrically conductive or they can all be electrically isolating. It is also possible for at least one of the adjustment layers to be electrically conductive and at least one of the other adjustment layers to be electrically insulating.

In one variant, the dielectric layer has a relatively high acoustic impedance, which is greater, e.g., by at least 20% than that of the piezoelectric layer. In this case, the core area of the wave guide is formed by the adjustment layer and the dielectric layer.

In one variant, the dielectric layer has a relatively low acoustic impedance $Z_{a1}$, which is lower, e.g., by at least 20% than that of the adjustment layer. The impedance $Z_{a1}$ is, for example, essentially equal to or less than the impedance $Z_{a0}$ of the piezoelectric layer. In this case, the second outer layer of the wave guide can be formed by the dielectric layer. Alternatively, the second outer layer of the wave guide comprises a composite of the dielectric layer and another layer that has a high acoustic velocity that is higher by at least 10% than that in the adjustment layer.

In one variant, the core area has a layer sequence whose terminal layers have a low propagation rate, wherein at least one layer arranged between the terminal layers has a higher propagation velocity. Thus, further adaptation of the wave profile is possible. This is the case, for example, for a continuous, electrically insulating adjustment layer.

The acoustic energy of a GBAW in a component working with GBAW is primarily concentrated in the area in which the wave is excited, i.e., at the boundary of the piezoelectric layer and the electrodes, and decays in two directions vertical to this area. This decay is achieved by the wave guide structure, which defines a velocity profile in the vertical direction.

Through suitable positioning of the adjustment layer at a certain distance from the piezoelectric layer, it is possible to shift the maximum of the energy density distribution of the wave, i.e., the maximum excursion of the material, from the boundary of the dielectric and piezoelectric layer into the interior of the dielectric layer.

The acoustic wave is guided partially in the piezo-layer and partially in the dielectric layer. The energy density profile defines the portion of the wave that propagates in the piezo-layer, as well as the portion of the wave that propagates in the dielectric layer.

The energy density profile of the acoustic wave depends on the distance between the piezo-layer and the adjustment layer. By increasing this distance, the wave portion in the dielectric layer can be increased. In this way, an energy density profile can be adjusted, which guarantees a relatively high electromechanical coupling, wherein simultaneously a relatively low temperature coefficient is achieved.

The adjustment layer is advantageously electrically conductive. Alternatively, the adjustment layer can be electrically insulating.

The electrodes are embedded between the piezoelectric layer and the dielectric layer. The dielectric layer covers the electrodes and in one variant forms a seal with the piezoelectric layer.

In another variant, the electrodes are covered by the adjustment layer with electrically insulating properties. In this case, each electrode defines a spacing area, so that several spacing areas are provided. Outside the spacing areas, i.e., in areas lying between the electrodes, the adjustment layer lies directly on the piezoelectric layer. In this case, a layer sequence comprising the electrodes and the adjustment layer is arranged between the piezoelectric layer and the dielectric layer.

If the adjustment layer is conductive, then the electrodes advantageously have a second electrode layer that is formed by the adjustment layer. The first electrode layer then represents a layer with a relatively low acoustic impedance and the second electrode layer represents a layer with a relatively high acoustic impedance. The adjustment layer used as a second electrode layer is advantageously structured corresponding to the first electrode layer.

The first electrode layer is arranged between the piezoelectric layer and the second electrode layer, so that the second electrode layer is spaced apart from the piezo-layer. The thickness of the first electrode layer advantageously equals at least 50 nm. In one advantageous variant, this thickness is even greater than 100 nm.

The second electrode layer is embedded between the first electrode layer and the dielectric layer.

The first electrode layer is advantageously arranged directly on the surface of the piezoelectric layer. It is used advantageously as a conductive spacing element between the piezoelectric layer and the adjustment layer. This can be electrically conductive as described above or electrically insulating in another variant. The adjustment layer is here arranged between the electrodes and the dielectric layer, wherein it is advantageously embedded there.

Alternatively, it is possible to arrange the dielectric layer between the adjustment layer and the piezoelectric layer. In this case, the adjustment layer is arranged between the dielectric layer and a cover layer explained below.

The adjustment layer advantageously has an opposite set temperature coefficient of the elastic constant compared to the piezoelectric layer. In this way an especially low temperature coefficient of the component can be set.

Furthermore, the spacing between the piezo-layer and the adjustment layer for achieving a low temperature coefficient is important. The height of the first electrode layer is advantageously selected according to the temperature coefficient of the adjustment layer and the piezo-layer in such a way that, as a whole, a very low temperature profile of the center frequency of, for example, a maximum of 25 ppb/K is set in the component.

The relatively light first electrode layer advantageously comprises a layer made from aluminum or an Al alloy, such as, e.g., AlCu. Alternatively, any metal can be used whose acoustic impedance is less than $Z_{a2}$. For example, the acoustic impedance of the first electrode layer equals a maximum of 2 $Z_{a0}$, in an advantageous variant a maximum of 1.5 $Z_{a0}$.

The relatively heavy second electrode layer or an electrically insulating adjustment layer, which is arranged on the electrodes, allows the use of any light electrode layers, e.g., as the first electrode layer, because a jump in impedance sufficient for the acoustic reflection is guaranteed, under some circumstances, just by the adjustment layer.

The relatively heavy second electrode layer advantageously contains metallic tungsten or molybdenum. Alternatively, other metals come into consideration whose acoustic impedance is greater than 1.5 $Z_{a,0}$. In this connection, in particular, gold or gold alloys come into consideration.

In addition, the electrodes can contain at least one other layer, such as, e.g., a copper or Ti layer, which has high conductivity or which is suitable as a bonding layer between the piezo-layer and the first electrode layer or between the first and second electrode layer.

The thickness of the dielectric layer advantageously lies on the order of magnitude of one wavelength, but can also equal more than one wavelength. In one advantageous variant, it equals a few micrometers, for example, up to 7 micrometers in the case of a component designed for ca. 1 GHz, or a maximum of five wavelengths.

Because the temperature coefficient of the component can be controlled through the use of an adjustment layer and, in particular, through the use of multi-layer electrodes with an adjustment layer, the dielectric layer can now be constructed especially thin. This has the advantage that the height of the component is minimal.

The dielectric layer advantageously contains $SiO_2$. Alternatively, any dielectric material that also has a negative temperature coefficient of its elastic constant, e.g., also $TeO_2$, comes into consideration.

The piezoelectric layer can be provided in the form of a single-crystal piezo-substrate, whose thickness equals at least ten wavelengths. The piezo-substrate advantageously contains $LiTaO_3$ or $LiNbO_3$ with a cut angle, at which a high electromechanical coupling is given.

The piezoelectric layer can be formed alternatively by a thin growth layer, which is arranged on a relatively thick, non-piezoelectric growth substrate.

In one variant, the layer system comprises a cover layer that is formed advantageously by an electrically non-conductive layer or an electrically insulating substrate. The dielectric layer is arranged between the cover layer and the piezoelectric substrate. The cover layer can be formed by a substrate whose thickness equals at least ten wavelengths.

In one variant, the cover layer comprises a substrate that contains elementary silicon and an electrically insulating passivation layer with which the via contact openings in the Si substrate are lined. Organic polymers also come into consideration as the material for the cover layer or as passivation of a partially electrically conductive substrate.

The specified component will now be explained with reference to schematic figures that are not to scale. Shown in cross section are:

DETAILED DESCRIPTION

Figure 1:
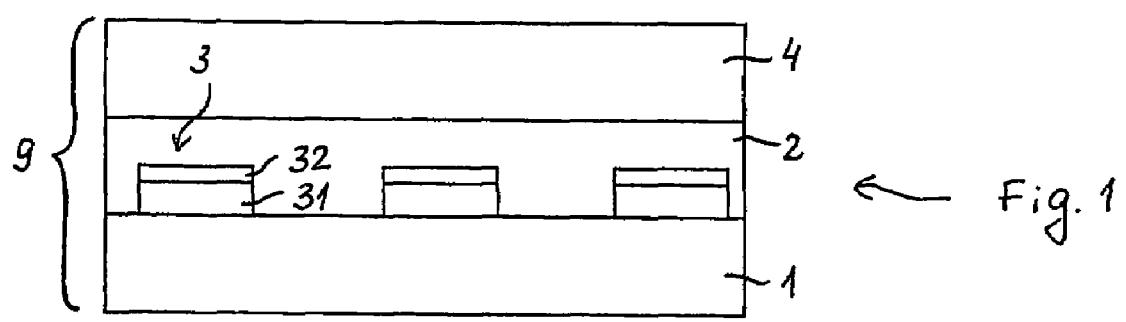
FIG. 1, a GBAW component with a multi-layer electrode, which has an adjustment layer spaced apart from the piezo-layer, FIG. 2, a variant of the component presented in FIG. 1, in which the adjustment layer is arranged between two lighter electrode layers, FIG. 3, a GBAW component, in which the adjustment layer is arranged between the piezoelectric layer and a dielectric layer, FIG. 4, a variant of the component presented in FIG. 3, in which the adjustment layer is arranged between the dielectric layer and a cover layer, FIG. 5, a GBAW component, in which the adjustment layer has recesses, FIG. 6, a variant of the component presented in FIG. 5, in which the adjustment layer is arranged with the recesses between the dielectric layer and a cover layer, FIG. 7, the top view of a transducer used in the GBAW component.

In FIG. 1, a component working with GBAW is presented with a wave guiding layer system 9, which comprises a piezo-layer 1, electrodes 3 arranged on the piezo-layer, a dielectric layer 2, and a cover layer 4.

Figure 7:
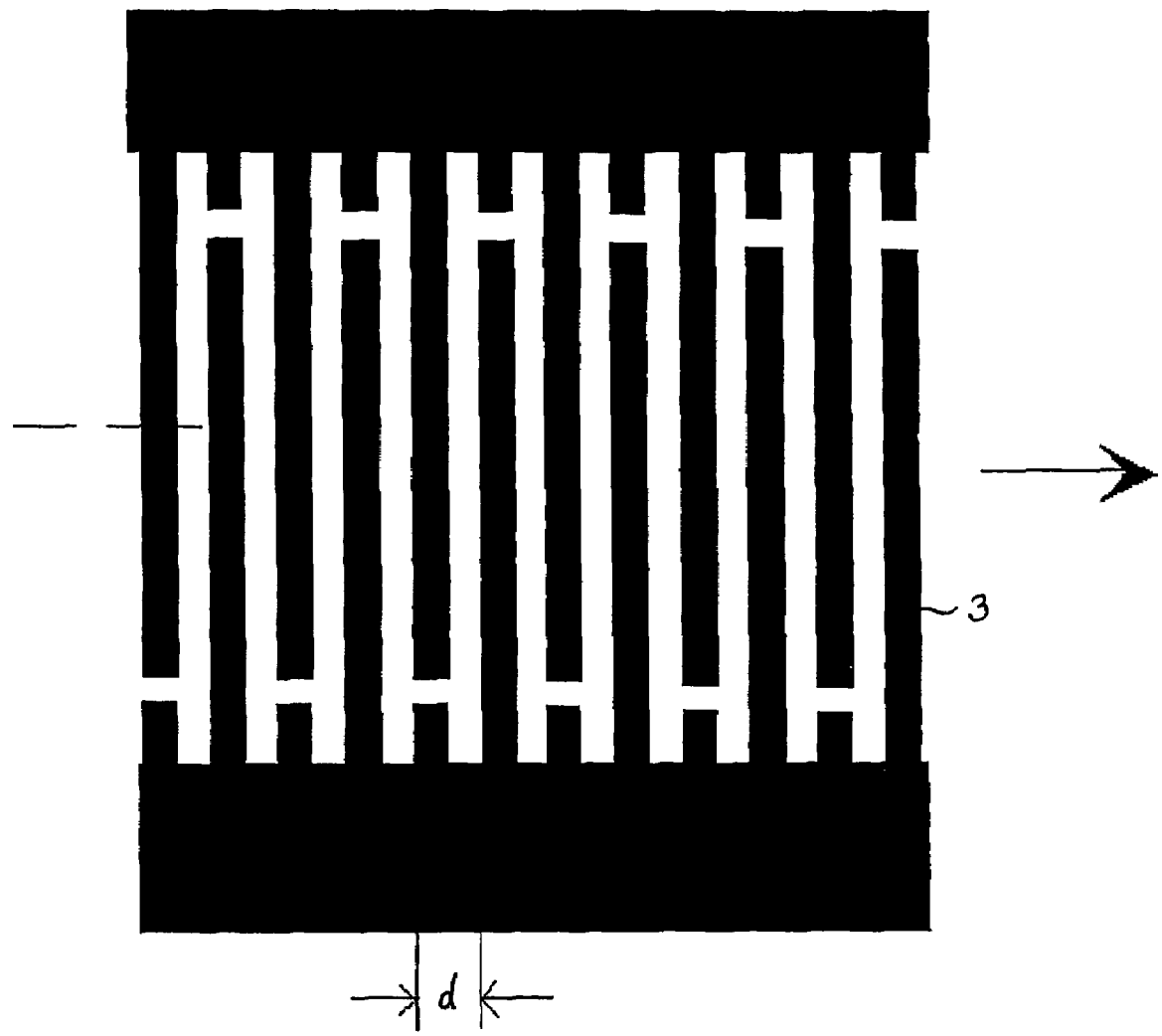

The electrodes 3 are allocated to an electroacoustic transducer, which is shown in FIG. 7 and in which an acoustic wave is excited. The wave propagates in a lateral plane perpendicular to the electrodes.

In the transducer, first electrodes connected conductively to each other and second electrodes connected conductively to each other are arranged in an alternating sequence. The spacing between the left or, alternatively, right edges of the successive electrodes is designated as the pitch d. Advantageously: $\lambda = 2\,d$.

Several successive electrodes connected to each other optionally conductively can also form at least one part of an acoustic reflector, in which wave excitation does not take place. The reflectors are used, e.g., for limiting an acoustic track. However, a reflector, which is partially permeable for the acoustic wave, can also be arranged in a transducer. The use of an adjustment layer with properties described above is also advantageous in the area of the reflector.

The dielectric layer 2 is arranged between the piezo-layer 1 and the cover layer 4. It covers the electrodes 3 and forms a seal with the piezo-layer 1, so that the electrodes 3 are embedded between the layers 1, 2.

The electrodes each have a first electrode layer 31 and a second electrode layer 32, e.g., made from W, a W alloy, or another layer with high acoustic impedance, which forms an adjustment layer. The first electrode layer 31 is arranged between the piezo-layer 1 and the second electrode layer 32.

The thickness of the first electrode layer 31 or the distance between the second electrode layer 32 and the piezo-layer 1 advantageously equals at least 35 nm. The thickness of the second electrode layer 32 advantageously equals at least $0.04\lambda$, i.e., 0.08 d.

The second electrode layer 32 can be replaced by an electrically non-conductive adjustment layer with the same base surface area as the first electrode layer. The thickness of the electrically non-conductive adjustment layer also advantageously equals at least $0.04\lambda$, i.e., 0.08 d.

Figure 2:
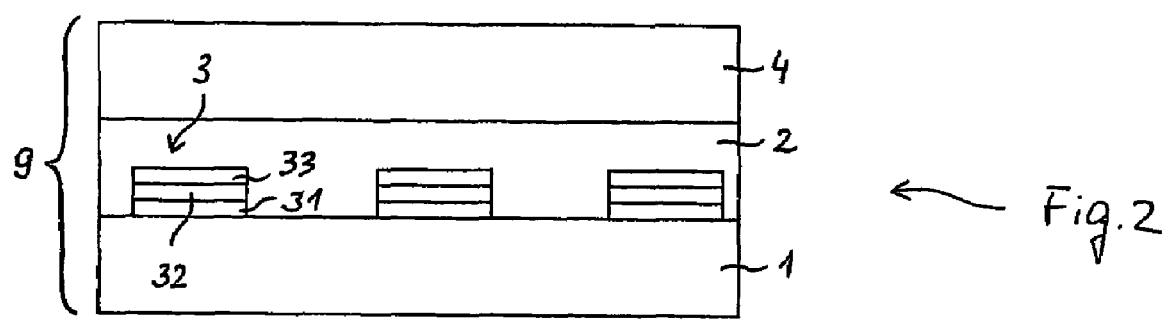

In FIG. 2, one variant of the component presented in FIG. 1 is shown, in which the adjustment layer, in this case, the second electrode layer 32, is arranged between two lighter electrode layers 31, 33. The electrode layers 31, 33 can be formed from the same material. However, the upper electrode layer 33 can also contain a conductive material, which is different from that of electrode layers 31 and 32.

The electrode layer 33 has a conductivity that advantageously exceeds that of the other electrode layers.

This layer advantageously contains Al and/or Cu. In one variant, this layer can be arranged between the first electrode layer 31 and the heavy electrode layer 32.

Figure 3:
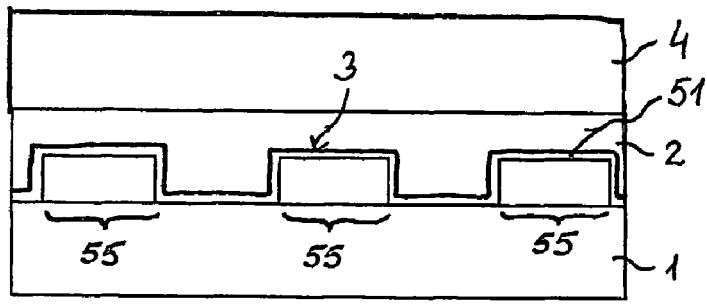

In FIG. 3, a GBAW component is shown in which the electrically non-conductive adjustment layer 51 covers the electrodes and otherwise forms a seal with the piezoelectric layer.

Figure 4:
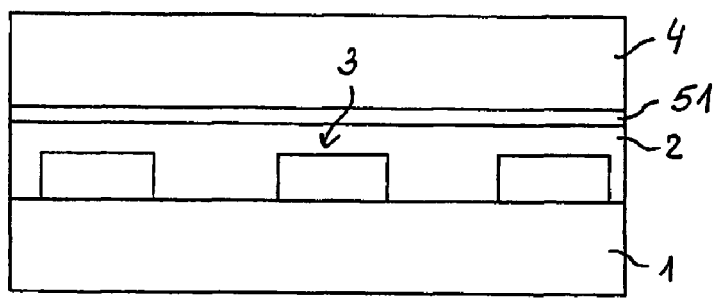

In FIG. 4, a GBAW component is shown in which the dielectric layer 2 is arranged between the piezo-layer 1 and an adjustment layer 51. The adjustment layer 51 is arranged between the dielectric layer 2 and the cover layer 4. In this case, the adjustment layer is advantageously electrically insulating.

The adjustment layer 32, 51 has the highest acoustic impedance in the layer system 9. The bordering layers—in FIGS. 1 and 4 the piezo-layer 1 and the dielectric layer 2, in FIG. 5 the dielectric layer 2 and the cover layer 4—have a lower impedance, so that, together with the adjustment layer, they form a wave guide.

The thickness of the dielectric layer 2 advantageously equals between $0.5\lambda$ and $5\lambda$. In one advantageous variant, the thickness equals at least $\lambda$. In this case, the wave decays within the dielectric layer, so that subsequent layers, in particular the cover layer 4, have only a relatively small effect on the desired wave propagation and therefore are not part of the wave guide. In this case, the layer system represents an asymmetric wave guide with only one impedance jump. In this case, the cover layer can be used for the realization of other component properties because it is not required for realizing the wave guide. In one variant, it can be used for passivation of the component as protection from moisture or as part of the housing of the component for increasing the stability of the housing.

In the variants according to FIGS. 1 to 4, the cover layer 4 can comprise, for example, Si, glass, $SiO_2$, or SiN. In the variants according to FIGS. 1, 2, and 3, the cover layer 4 can be eliminated with a sufficiently thick dielectric layer 2, whose thickness equals at least one wavelength.

Figure 5:
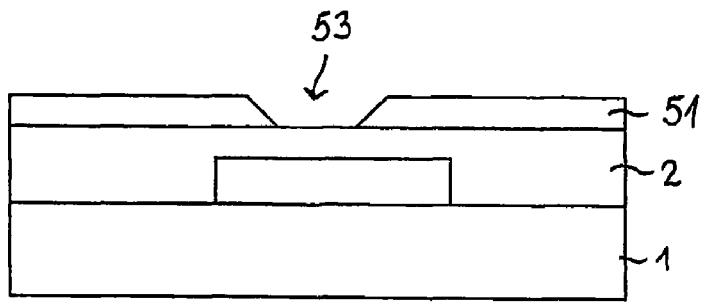

In FIG. 5, a GBAW component is shown in which the adjustment layer 51 has a recess 53 advantageously within the acoustic track, in which the electrodes 3 of a transducer are arranged. This recess lies, e.g., above the electrode 3 and advantageously extends along this electrode. Such strip-shaped recesses of the adjustment layer 51 can also be formed above other electrodes. Through these breaks in the adjustment layer, additional reflection positions for the acoustic wave are formed. Thus, advantageously the acoustic reflection and the energy distribution of the acoustic wave are affected. The wave is reflected at the additional reflection positions, so that an adjustment layer structured in this way can also form a reflector for the wave without electrodes lying underneath. In one reflector, the electrodes can even be eliminated.

The recesses 53 advantageously form an essentially periodic arrangement similar to the electrodes 3. According to the configuration, the recesses 53 can be offset outside the electrodes or with respect to the wave propagation direction, e.g., in a projection plane between the electrodes.

Figure 6:
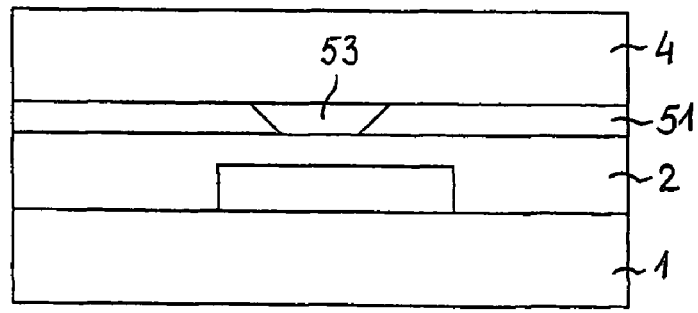

The adjustment layer 51, which has recesses 53, is advantageously arranged as in FIG. 6 between the dielectric layer 2 and a cover layer 4.

In the variants according to FIGS. 1, 2, 4, and 5, the adjustment layer 32, 51 is structured. In the variants according to FIGS. 3 and 4, the adjustment layer 51 is formed, in contrast, as a large surface area, contiguous layer, which has no breaks, for example, in the electroacoustically active area of a transducer.

The adjustment layer 32, 51 is spaced apart from the piezoelectric layer 1 in at least one spacing area. In the variants according to FIGS. 1, 2, the spacing area for the adjustment layer 32 is defined by the first electrode layer 31.

In FIG. 3, spacing areas 55 for the adjustment layer 51 are defined by the electrodes 3. Outside the spacing areas 55, i.e., in areas between the electrodes 3, the adjustment layer lies directly on the piezoelectric layer 1.

In FIGS. 4 to 6, the spacing area for the adjustment layer 51 is defined by the dielectric layer 2.

In improvements of the component it is provided that at least one of the layers 1, 2, 4, and 51 is structured for electrical contacting of the electrodes 3 or contact surfaces connected conductively to these electrodes advantageously outside the acoustic track, in order to conductively connect the electrodes to connection surfaces on the exposed surface of the GBAW component. The component can have additional layers not shown in the figures.

At least one additional adjustment layer can be provided. For example, the first adjustment layer can be formed by an electrode layer 32 or another conductive layer. In one advantageous variant, the second adjustment layer is spaced apart from the first adjustment layer, e.g., by the dielectric layer 2. With respect to the arrangement of the adjustment layers, any combination of the embodiments shown in the figures is possible.

The second adjustment layer is advantageously electrically insulating. Alternatively, it can be electrically conductive.

In principle, each adjustment layer can also be made from several different sub-layers. This applies also for the piezoelectric layer 1, the dielectric layer 2, and the cover layer 4.

The invention claimed is:

1. A component working with guided acoustic waves, the component comprising:
   a layer system configured to guide waves in a lateral plane, the layer system comprising:
   a piezoelectric layer;
   electrodes on the piezoelectric layer for exciting the waves,
   a dielectric layer with an acoustic impedance; and
   an adjustment layer with an acoustic impedance,
   wherein:
      a ratio of the acoustic impedance of the adjustment layer to the acoustic impedance of the dielectric layer is greater than 1.5;
      an acoustic impedance of the adjustment layer is greater than the acoustic impedance of each of the other layers included in the layer system, the adjustment layer is configured to substantially influence an acoustic reflection of the waves and the adjustment layer is spaced apart from the piezoelectric layer in at least one spacing area;
      the electrodes comprise a first electrode layer with an acoustic impedance between the piezoelectric layer and the adjustment layer, wherein a ratio of the acoustic impedance of the first electrode layer to the acoustic impedance of the dielectric layer is between 0.5 and 2; and
   a height of the first electrode layer is configured such that the component has a temperature coefficient of a maximum of 25 ppb/K.

2. A component working with guided acoustic waves, the component comprising:
   a layer system configured to guide waves in a lateral plane, the layer system comprising:
   a piezoelectric layer;
   electrodes on the piezoelectric layer for exciting the waves,
   a dielectric layer with an acoustic impedance, and
   an adjustment layer with an acoustic impedance;
   wherein a ratio of the acoustic impedance of the adjustment layer to the acoustic impedance of the dielectric layer is greater than 1.5, and
   the adjustment layer is spaced apart from the piezoelectric layer in at least one spacing area and is arranged between the electrodes and the dielectric layer.

3. The component of claim 2, wherein the adjustment layer is deposited directly on the electrodes and on the piezoelectric layer in areas between the electrodes.

4. A component working with guided acoustic waves, the component comprising:
- a layer system configured to guide waves in a lateral plane, the layer system comprising:
- a piezoelectric layer;
- electrodes on the piezoelectric layer for exciting the waves,
- a dielectric layer with an acoustic impedance; and
- an adjustment layer with an acoustic impedance, wherein:
    - a ratio of the acoustic impedance of the adjustment layer to the acoustic impedance of the dielectric layer is greater than 1.5, and
    - an acoustic impedance of the adjustment layer is greater than the acoustic impedance of each of the other layers included in the layer system, the adjustment layer is configured to substantially influence an acoustic reflection of the waves and the adjustment layer is spaced apart from the piezoelectric layer in at least one spacing area;
    - the electrodes comprise a first electrode layer with an acoustic impedance between the piezoelectric layer and the adjustment layer, wherein a ratio of the acoustic impedance of the first electrode layer to the acoustic impedance of the dielectric layer is between 0.5 and 2; and
    - the first electrode layer is at least 50 nm thick.

5. The component of claim 4, wherein the ratio of the acoustic impedance of the adjustment layer to the acoustic impedance of the dielectric layer is greater than 2.5.

6. The component of claim 4, wherein the electrodes are between the piezoelectric layer and the dielectric layer.

7. The component of claim 4, wherein the dielectric layer is between the adjustment layer and the piezoelectric layer.

8. The component of claim 4, wherein the adjustment layer is electrically insulating.

9. The component of claim 8, wherein the adjustment layer is configured to form a seal with the piezoelectric layer outside the at least one spacing area.

10. The component of claim 4, wherein the adjustment layer is electrically conductive.

11. The component of claim 4, wherein:
- the adjustment layer is configured to form a second electrode layer, and
    - the first electrode layer is between the piezoelectric layer and the second electrode layer.

12. The component of claim 4, wherein the dielectric layer has a temperature coefficient of the elastic constant opposite that of the piezoelectric layer.

13. The component of claim 4, wherein the dielectric layer comprises $SiO_2$.

14. The component of claim 4, wherein the acoustic impedance of the first electrode layer is less than the acoustic impedance of the adjustment layer.

15. The component of claim 4, wherein:
- the layer system further comprises a cover layer; and
- the dielectric layer is between the cover layer and the piezoelectric layer.

16. The component of claim 15, wherein the cover layer is formed by the dielectric layer.

17. The component of claim 15, wherein the cover layer comprises elementary silicon.

18. A component working with guided acoustic waves, the component comprising:
- a layer system configured to guide waves in a lateral plane, the layer system comprising:
- a piezoelectric layer;
- electrodes on the piezoelectric layer for exciting the waves,
- a dielectric layer with an acoustic impedance, and
- an adjustment layer with an acoustic impedance, wherein:
    - a ratio of the acoustic impedance of the adjustment layer to the acoustic impedance of the dielectric layer is greater than 1.5,
    - the adjustment layer is spaced apart from the piezoelectric layer in at least one spacing area,
    - the electrodes comprise a first electrode layer with an acoustic impedance between the piezoelectric layer and the adjustment layer, wherein a ratio of the acoustic impedance of the first electrode layer to the acoustic impedance of the dielectric layer is between 0.5 and 2; and
    - the first electrode layer is at least 50 nm thick.

19. A component working with guided acoustic waves, the component comprising:
- a layer system configured to guide waves in a lateral plane, the layer system comprising:
- a piezoelectric layer;
- electrodes on the piezoelectric layer for exciting the waves,
- a dielectric layer with an acoustic impedance, and
- an adjustment layer with an acoustic impedance, wherein:
    - a ratio of the acoustic impedance of the adjustment layer to the acoustic impedance of the dielectric layer is greater than 1.5,
    - the adjustment layer is spaced apart from the piezoelectric layer in at least one spacing area,
    - the electrodes comprise a first electrode layer with an acoustic impedance between the piezoelectric layer and the adjustment layer, wherein a ratio of the acoustic impedance of the first electrode layer to the acoustic impedance of the dielectric layer is between 0.5 and 2; and
    - a height of the first electrode layer is configured such that the component has a temperature coefficient of a maximum of 25 ppb/K.

* * * * *